US011043527B2

(12) United States Patent
Kanehara et al.

(10) Patent No.: US 11,043,527 B2
(45) Date of Patent: Jun. 22, 2021

(54) IMAGING DEVICE

(71) Applicant: Panasonic Intellectual Property Management Co., Ltd., Osaka (JP)

(72) Inventors: Hidenari Kanehara, Kyoto (JP); Yusuke Okada, Osaka (JP); Sanshiro Shishido, Osaka (JP); Kazuko Nishimura, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 192 days.

(21) Appl. No.: 16/441,144

(22) Filed: Jun. 14, 2019

(65) Prior Publication Data

US 2019/0393259 A1 Dec. 26, 2019

(30) Foreign Application Priority Data

Jun. 26, 2018 (JP) .............................. JP2018-120787

(51) Int. Cl.
*H01L 27/14* (2006.01)
*H01L 27/146* (2006.01)

(52) U.S. Cl.
CPC .. *H01L 27/14643* (2013.01); *H01L 27/14612* (2013.01); *H01L 27/14636* (2013.01)

(58) Field of Classification Search
CPC ......... H01L 27/14612; H01L 27/14636; H01L 27/14643; H04N 5/357; H04N 5/363

USPC ...................................................... 250/208.1
See application file for complete search history.

(56) References Cited

U.S. PATENT DOCUMENTS

| 2006/0001752 | A1 | 1/2006 | Yanagisawa et al. |
| 2008/0173794 | A1 | 7/2008 | Oike et al. |
| 2015/0146061 | A1 | 5/2015 | Ishii |
| 2016/0360131 | A1* | 12/2016 | Shimasaki ............. H04N 5/378 |

FOREIGN PATENT DOCUMENTS

| JP | 2006-019927 | 1/2006 |
| JP | 2007-214832 | 8/2007 |
| JP | 2016-127593 | 7/2016 |
| JP | 2017-158191 | 9/2017 |

* cited by examiner

*Primary Examiner* — Kevin K Pyo
(74) *Attorney, Agent, or Firm* — McDermott Will and Emery LLP

(57) ABSTRACT

An imaging device includes: a first pixel and a second pixel that are arranged along a first direction and each include a photoelectric converter, a charge accumulator, a first transistor one of a source and a drain of which is connected to the charge accumulator, and a second transistor a gate of which is connected to the charge accumulator; a first line and a second line that each extend along the first direction; a first voltage supply circuit configured to generate a voltage between a first voltage turning on the first transistor of the first pixel and a second voltage turning off the first transistor of the first pixel; and a second voltage supply circuit configured to generate a voltage between a fourth voltage turning on the first transistor of the second pixel and a fifth voltage turning off the first transistor of the second pixel.

14 Claims, 12 Drawing Sheets

IMAGING DEVICE

BACKGROUND

1. Technical Field

The present disclosure relates to an imaging device.

2. Description of the Related Art

Charge coupled device (CCD) image sensors and complementary metal oxide semiconductor (CMOS) image sensors have been widely used in digital cameras and the like.

Noise reduction is demanded in the field of imaging device. Specifically, there is a demand for reduction of kTC noise (also called "reset noise") that occurs when a charge generated by photoelectric conversion is reset. Japanese Unexamined Patent Application Publication No. 2016-127593 discloses an imaging device that forms feedback paths for respective pixel cells in an imaging area to cancel the reset noise by the negative feedback.

SUMMARY

One non-limiting and exemplary embodiment provides an imaging device that achieves high-speed operation while reducing the reset noise.

In one general aspect, the techniques disclosed here feature an imaging device according to an aspect of the present disclosure including: a first pixel and a second pixel that are arranged along a first direction, the first pixel and the second pixel each including a photoelectric converter that converts light into a charge, a charge accumulator that accumulates the charge, a first transistor one of a source and a drain of which is connected to the charge accumulator, and a second transistor a gate of which is connected to the charge accumulator; a first line and a second line that each extend along the first direction; a first voltage supply circuit that is connected to the first transistor of the first pixel through the first line, the first voltage supply circuit being configured to generate a third voltage, the third voltage being a voltage between a first voltage turning on the first transistor of the first pixel and a second voltage turning off the first transistor of the first pixel; and a second voltage supply circuit that is connected to the first transistor of the second pixel through the second line, the second voltage supply circuit being configured to generate a sixth voltage, the sixth voltage being a voltage between a fourth voltage turning on the first transistor of the second pixel and a fifth voltage turning off the first transistor of the second pixel.

It should be noted that inclusive or specific aspects may be implemented as an element, device, module, system, method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
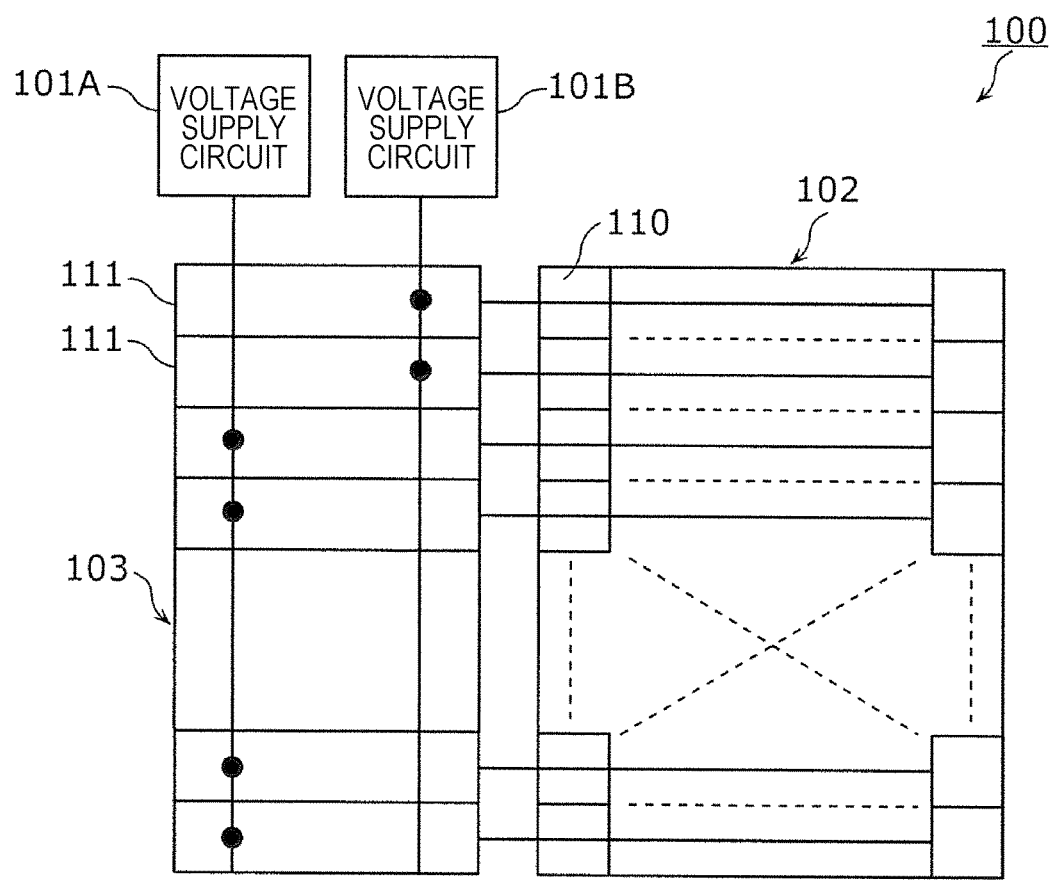
FIG. 1 is a block diagram of an imaging device according to a first embodiment of the present disclosure.

Summary of an aspect of the present disclosure will be described as the following appendixes.

[Item 1]

An imaging device including:

a first pixel and a second pixel that are arranged along a first direction, the first pixel and the second pixel each including a photoelectric converter that converts light into a charge, a charge accumulator that accumulates the charge, a first transistor one of a source and a drain of which is connected to the charge accumulator, and a second transistor a gate of which is connected to the charge accumulator;

a first line and a second line that each extend along the first direction;

a first voltage supply circuit that is connected to the first transistor of the first pixel through the first line, the first voltage supply circuit being configured to generate a third voltage, the third voltage being a voltage between a first voltage turning on the first transistor of the first pixel and a second voltage turning off the first transistor of the first pixel; and a second voltage supply circuit that is connected to the first transistor of the second pixel through the second line, the second voltage supply circuit being configured to generate a sixth voltage, the sixth voltage being a voltage between a fourth voltage turning on the first transistor of the second pixel and a fifth voltage turning off the first transistor of the second pixel.

[Item 2]

The imaging device according to Item 1, further including:

a first bias circuit that is connected to one of a source and a drain of the second transistor of the first pixel; and a second bias circuit that is connected to one of a source and a drain of the second transistor of the second pixel.

[Item 3]

The imaging device according to Item 2, in which the first bias circuit generates two voltages different from each other, and the second bias circuit generates two voltages different from each other.

[Item 4]

The imaging device according to any one of Items 1 to 3, further including a third line and a fourth line that each extend along the first direction, wherein the first bias circuit is connected to the one of the source and the drain of the second transistor of the first pixel through the third line, and the second bias circuit is connected to the one of the source and the drain of the second transistor of the second pixel through the fourth line.

[Item 5]

The imaging device according to any one of Items 1 to 4, in which the first voltage supply circuit is connected to a gate of the first transistor of the first pixel, and the second voltage supply circuit is connected to a gate of the first transistor of the second pixel.

[Item 6]

The imaging device according to any one of Items 1 to 4, in which the first voltage supply circuit is connected to the other one of the source and the drain of the first transistor of the first pixel, and the second voltage supply circuit is connected to the other one of the source and the drain of the first transistor of the second pixel.

[Item 7]

The imaging device according to any one of Items 1 to 6, in which each of the third voltage and the sixth voltage has a voltage value that is changed with time in a tapered shape.

[Item 8]

The imaging device according to any one of Items 1 to 7, in which the first pixel and the second pixel each include a third transistor connected between the charge accumulator and the one of the source and the drain of the first transistor.

[Item 9]

The imaging device according to any one of Items 1 to 8, further including a first vertical signal line and a second vertical signal line that each extend in the first direction, wherein the first vertical signal line is connected to the other one of the source and the drain of the second transistor of the first pixel, and the second vertical signal line is connected to the other one of the source and the drain of the second transistor of the second pixel.

[Item 10]

The imaging device according to Item 9, in which the first pixel includes a fourth transistor connected between the first vertical signal line and the other one of the source and the drain of the second transistor, and the second pixel includes a fifth transistor connected between the second vertical signal line and the other one of the source and the drain of the second transistor.

Hereinafter, embodiments of the present disclosure are described in detail with reference to the drawings.

The embodiments described below show inclusive or specific examples. The numerical values, shapes, materials, constituents, arrangement and connection configuration of the constituents, steps, order of the steps, and so on provided in the embodiments below are merely an example and not intended to limit the present disclosure. The various aspects described in this specification can be combined with each other as long as there is no conflict. Among the constituents in the following embodiments, constituents that are not described in the independent claim stating the primary concept are described as arbitrary constituents. In the following descriptions, constituents having substantially the same functions may be denoted by the common reference numerals, and descriptions thereof may be omitted.

An imaging device according to an aspect of the present disclosure is an imaging device including: a pixel array formed of multiple pixels arranged in m rows and n columns (m, n are integers equal to or greater than 1), in which the multiple pixels include a first pixel in an a-th row (a is an integer equal to or greater than 1 but equal to or smaller than m) and a second pixel in a b-th row (b is an integer equal to or greater than 1 but equal to or smaller than m, b is not equal to a), in which the multiple pixels each include a photoelectric converter that converts light to a charge, a charge accumulator that accumulates the charge, a first transistor one of a source and a drain of which is electrically connected to the charge accumulator, and a second transistor a gate of which is electrically connected to the charge accumulator, in which the imaging device further includes a first voltage supply circuit electrically connected to a gate of the first transistor of the first pixel and a second voltage supply circuit electrically connected to a gate of the first transistor of the second pixel, in which the first voltage supply circuit outputs a third voltage, which is a voltage between a first voltage turning on the first transistor of the first pixel and a second voltage turning off the first transistor of the first pixel, to the gate of the first transistor of the first pixel, and the second voltage supply circuit outputs a sixth voltage, which is a voltage between a fourth voltage turning on the first transistor of the second pixel and a fifth voltage turning off the first transistor of the second pixel, to the gate of the first transistor of the second pixel.

With this configuration, it is possible to reduce the reset noise by performing noise cancelling. In addition, it is possible to individually set the timings of noise cancelling operations of the first pixel and the second pixel. As a result, the imaging device can achieve high-speed operation while reducing the reset noise.

An imaging device according to an aspect of the present disclosure is an imaging device including: a pixel array formed of multiple pixels arranged in m rows and n columns (m, n are integers equal to or greater than 1), in which the multiple pixels include a first pixel in an a-th row (a is an integer equal to or greater than 1 but equal to or smaller than m) and a second pixel in a b-th row (b is an integer equal to or greater than 1 but equal to or smaller than m, b is not equal to a), in which the multiple pixels each include a photoelectric converter that converts light to a charge, a charge accumulator that accumulates the charge, a first transistor one of a source and a drain of which is electrically connected to the charge accumulator, and a second transistor a gate of which is electrically connected to the charge accumulator, in which the imaging device further includes a first voltage supply circuit that is electrically connected to the other one of the source and the drain of the first transistor of the first pixel and a second voltage supply circuit that is electrically connected to the other one of the source and the drain of the first transistor of the second pixel.

With this configuration, it is possible to reduce the reset noise by performing noise cancelling. In addition, it is possible to individually set the timings of noise cancelling operations of the first pixel and the second pixel. As a result, the imaging device can achieve high-speed operation while reducing the reset noise.

For example, the first voltage supply circuit may output a third voltage, which is a voltage between a first voltage turning on the first transistor of the first pixel and a second voltage turning off the first transistor of the first pixel, to the other one of the source and the drain of the first transistor of the first pixel, and the second voltage supply circuit may output a sixth voltage, which is a voltage between a fourth voltage turning on the first transistor of the second pixel and a fifth voltage turning off the first transistor of the second pixel, to the other one of the source and the drain of the first transistor of the second pixel.

With this configuration, it is possible to reduce the reset noise by performing noise cancelling.

For example, the first voltage supply circuit may output the third voltage to the gate of the first transistor of the first pixel in a second period, which is after a first period in which the first voltage is applied to the gate of the first transistor of the first pixel, and the second voltage supply circuit may output the sixth voltage to the gate of the first transistor of the second pixel in a fourth period, which is after a third period in which the fourth voltage is applied to the gate of the first transistor of the second pixel.

With this configuration, it is possible to reduce the reset noise by performing noise cancelling.

For example, the first voltage supply circuit may output the third voltage to the other one of the source and the drain of the first transistor of the first pixel in a second period, which is after a first period in which the first voltage is applied to the other one of the source and the drain of the first transistor of the first pixel, and the second voltage supply circuit may output the sixth voltage to the other one of the source and the drain of the first transistor of the second pixel in a fourth period, which is after a third period in which the fourth voltage is applied to the other one of the source and the drain of the first transistor of the second pixel.

With this configuration, it is possible to reduce the reset noise by performing noise cancelling.

For example, the third voltage and the sixth voltage may be tapered voltages.

With this configuration, it is possible to reduce the reset noise by performing noise cancelling.

For example, at least a part of the second period and a part of the fourth period may coincide with each other.

For example, the second period and the fourth period may include periods that do not coincide with each other.

With this configuration, the timing in which the first voltage is applied to the first transistor of the first pixel and the timing in which the fourth voltage is applied to the first transistor of the second pixel may be set to be different from each other. As a result, it is possible to reduce the noise more than a case where the timing in which the first voltage is applied to the first transistor of the first pixel and the timing in which the fourth voltage is applied to the first transistor of the second pixel are the same.

For example, the multiple pixels may each include a third transistor one of a source and a drain of which may be electrically connected to the charge accumulator and the other one of the source and the drain may be electrically connected to the one of the source and the drain of the first transistor.

For example, the first voltage supply circuit and the second voltage supply circuit may be located on the left of the pixel array.

For example, the first voltage supply circuit may be located above the pixel array, and the second voltage supply circuit may be located below the pixel array.

With this configuration, delays of the application of the voltage from the first voltage supply circuit and the application of the voltage from the second voltage supply circuit can be averaged between the upper and lower rows. As a result, it is possible to uniform the shading.

For example, the first voltage supply circuit may be located on the left of the pixel array, and the second voltage supply circuit may be located on the right of the pixel array.

With this configuration, the balance of the circuit positions on the entire chip is improved. Since coupling of a line for outputting the voltage from the first voltage supply circuit and a line for outputting the voltage from the second voltage supply circuit can be reduced, it is possible to reduce the noise.

For example, the imaging device may include a third voltage supply circuit that is located on the left of the pixel array and is electrically connected to the gate of the first transistor of the first pixel and a fourth voltage supply circuit that is located on the right of the pixel array and is electrically connected to the gate of the first transistor of the second pixel, in which the third voltage supply circuit may output a ninth voltage, which is a voltage between a seventh voltage turning on the first transistor of the first pixel and an eighth voltage turning off the first transistor of the first pixel, to the gate of the first transistor of the first pixel, and the fourth voltage supply circuit may output a twelfth voltage, which is a voltage between a tenth voltage turning on the first transistor of the second pixel and an eleventh voltage turning off the first transistor of the second pixel, to the gate of the first transistor of the second pixel.

With this configuration, it is possible to drive the multiple pixels at high-speed since the voltages are supplied from the voltage supply circuits on the right and left of the pixel array to the pixels.

For example, the imaging device may include a third voltage supply circuit that is electrically connected to the one of the source and the drain of the first transistor of the first pixel and a fourth voltage supply circuit that is electrically connected to the one of the source and the drain of the first transistor of the second pixel.

With this configuration, it is possible to drive the multiple pixels at high-speed since the voltages are supplied from the multiple voltage supply circuits to the pixels.

For example, the first voltage supply circuit and the second voltage supply circuit may be located on the left of the pixel array, the third voltage supply circuit and the fourth voltage supply circuit may be located on the right of the pixel array, the first voltage supply circuit and the third voltage supply circuit may be located above the pixel array, and the second voltage supply circuit and the fourth voltage supply circuit may be located below the pixel array.

With this configuration, the balance of the circuit positions on the entire chip is improved.

First Embodiment

An imaging device according to this embodiment is described with reference to FIGS. 1 to 7. FIG. 1 is a diagram that illustrates an exemplary configuration of an imaging device 100 according to this embodiment. The imaging device 100 illustrated in FIG. 1 includes a pixel array 102, which includes multiple pixels 110, and peripheral circuits. The multiple pixels 110 form a pixel area by, for example, being arranged two-dimensionally on a semiconductor substrate. In the illustrated example, the center of each pixel 110 is positioned on a grid point of a square grid. Needless to say, arrangement of the pixels 110 is not limited to the illustrated example, and the pixels 110 may be arranged such that the center of each pixel 110 is positioned on a grid point of a triangle grid, hexagon grid, or the like. The pixels 110 may be arranged one-dimensionally. In this case, the imaging device 100 may be used as a line sensor.

In the configuration illustrated in FIG. 1, the peripheral circuits include a voltage supply circuit 101A, a voltage supply circuit 101B, and a row selection circuit 103. The row selection circuit 103 includes row drivers 111 arranged in array. The voltage supply circuits 101A and 101B are respectively connected to the pixels 110 in different rows in the pixel array 102 through the row selection circuit 103. The peripheral circuits may be arranged on the semiconductor substrate on which the pixel array 102 is formed, or some of the peripheral circuits may be arranged on another substrate.

Figure 2:
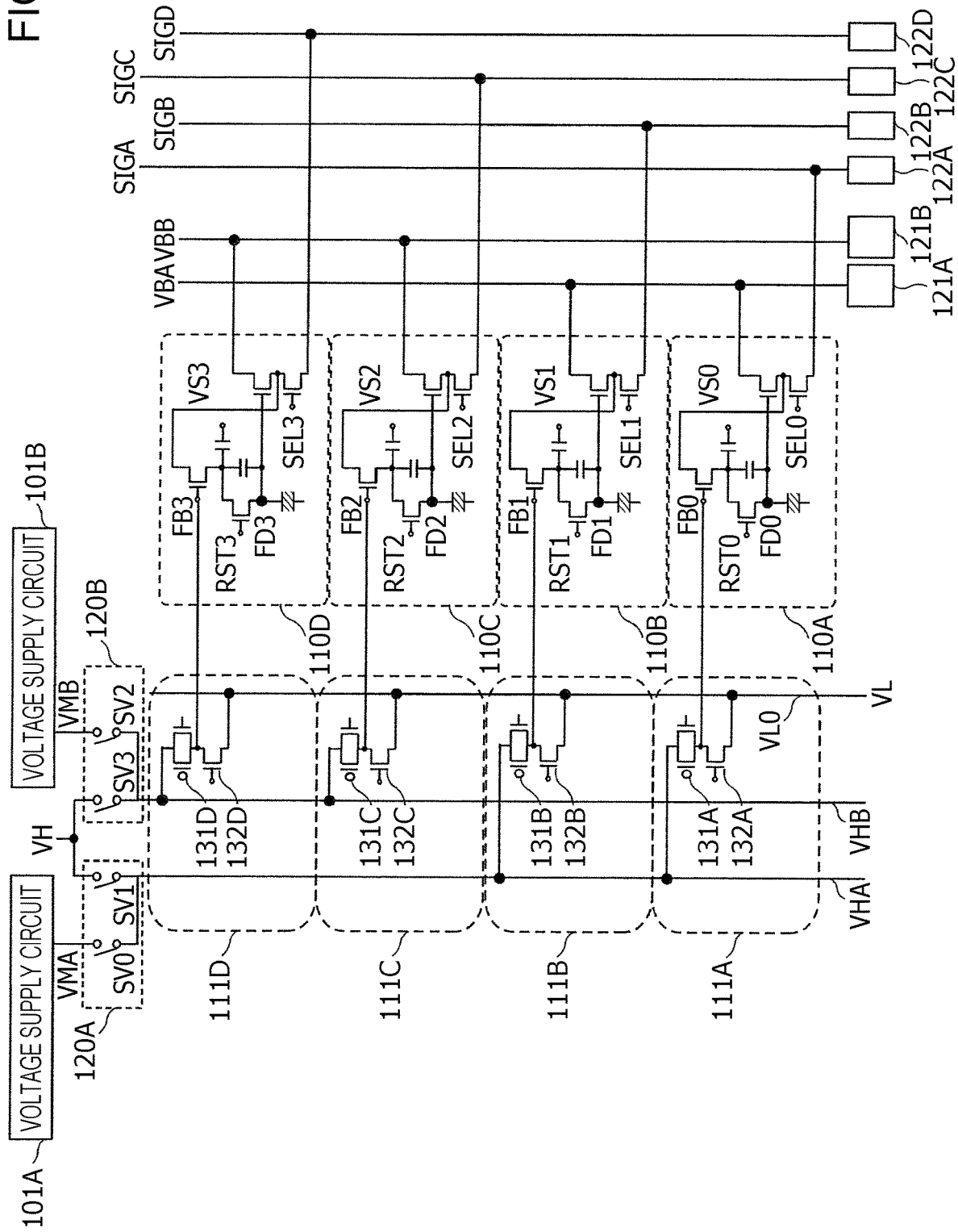
FIG. 2 is a diagram that illustrates a configuration of the imaging device according to the first embodiment of the present disclosure.

Details of a configuration of a part of the imaging device 100 are described with reference to FIG. 2. FIG. 2 is a diagram that illustrates the configuration of the imaging device 100. For simple description, FIG. 2 illustrates only a configuration corresponding to the pixels 110 in four rows and one column. A pixel 110A is in a zeroth row, a pixel 110B is in a first row, a pixel 110C is in a second row, and a pixel 110D is in a third row. The pixels 110A to 110D are in the same column. The direction in which these pixels are arranged exemplifies a first direction. For example, the pixel 110A exemplifies a first pixel, and the pixel 110C exemplifies a second pixel.

The voltage supply circuit 101A generates a middle voltage VMA between a high voltage VH and a low voltage VL. The voltage supply circuit 101B generates a middle voltage VMB between the high voltage VH and the low voltage VL. Specifically, the middle voltages VMA and VMB are tapered voltages that change gradually. For example, the voltage supply circuits 101A and 101B each include a digital-analog converter (DAC) and a low-pass filter. A signal generated by the DAC is inputted to the low-pass filter, and an output signal from the low-pass filter is outputted as the abovementioned middle voltage VMA or VMB.

A voltage switching circuit 120A is connected to the voltage supply circuit 101A and a power source line VHA. The voltage switching circuit 120A outputs either of the voltage VH and the middle voltage VMA generated by the voltage supply circuit 101A to the power source line VHA. Specifically, the voltage switching circuit 120A includes a switch SV0 and a switch SV1. When the switch SV0 is turned on and the switch SV1 is turned off, the middle voltage VMA is outputted to the power source line VHA. When the switch SV0 is turned off and the switch SV1 is turned on, the voltage VH is outputted to the power source line VHA. The power source lines VHA and VHB extend in the direction in which the pixels 110A to 110D are arranged. The power source line VHA exemplifies a first line. The power source line VHB exemplifies a second line.

The voltage switching circuit 120B is connected to the voltage supply circuit 101B and the power source line VHB. The voltage switching circuit 120B outputs either of the voltage VH and the middle voltage VMB generated by the voltage supply circuit 101B to the power source line VHB. Specifically, the voltage switching circuit 120B includes a switch SV2 and a switch SV3. When the switch SV2 is turned on and the switch SV3 is turned off, the middle voltage VMB is outputted to the power source line VHB. When the switch SV2 is turned off and the switch SV3 is turned on, the voltage VH is outputted to the power source line VHB.

A row driver 111A is connected to the power source line VHA, a power source line VL0, and a control line FB0. The row driver 111A outputs the voltage VH or VMA outputted through the power source line VHA or the voltage VL outputted through the power source line VL0 to the control line FB0. Specifically, the row driver 111A includes a switch 131A and a switch 132A. The switch 131A is connected between the power source line VHA and the control line FB0, and the switch 132A is connected between the power source line VL0 and the control line FBO. When the switch 131A is turned on and the switch 132A is turned off, the voltage VH or VMA is outputted to the control line FB0 through the power source line VHA. When the switch 131A is turned off and the switch 132A is turned on, the voltage VL is outputted to the control line FB0 through the power source line VL0.

A row driver 111B is connected to the power source line VHA, the power source line VL0, and a control line FB1. The row driver 111B outputs the voltage VH or VMA outputted through the power source line VHA or the voltage VL outputted through the power source line VL0 to the control line FB1. Specifically, the row driver 111B includes a switch 131B and a switch 132B. The switch 131B is connected between the power source line VHA and the control line FB1, and the switch 132B is connected between the power source line VL0 and the control line FB1. When the switch 131B is turned on and the switch 132B is turned off, the voltage VH or VMA is outputted to the control line FB1 through the power source line VHA. When the switch 131B is turned off and the switch 132B is turned on, the voltage VL is outputted to the control line FBI through the power source line VL0.

A row driver 111C is connected to the power source line VHB, the power source line VL0, and a control line FB2. The row driver 111C outputs the voltage VH or VMB outputted through the power source line VHB or the voltage VL outputted through the power source line VL0 to the control line FB2. Specifically, the row driver 111C includes a switch 131C and a switch 132C. The switch 131C is connected between the power source line VHB and the control line FB2, and the switch 132C is connected between the power source line VL0 and the control line FB2. When the switch 131C is turned on and the switch 132C is turned off, the voltage VH or VMB is outputted to the control line FB2 through the power source line VHB. When the switch 131C is turned off and the switch 132C is turned on, the voltage VL is outputted to the control line FB2 through the power source line VL0.

A row driver 111D is connected to the power source line VHB, the power source line VL0, and a control line FB3. The row driver 111D outputs the voltage VH or VMB outputted through the power source line VHB or the voltage VL outputted through the power source line VL0 to the control line FB3. Specifically, the row driver 111D includes a switch 131D and a switch 132D. The switch 131D is connected between the power source line VHB and the control line FB3, and the switch 132D is connected between the power source line VL0 and the control line FB3. When the switch 131D is turned on and the switch 132D is turned off, the voltage VH or VMB is outputted to the control line FB3 through the power source line VHB. When the switch 131D is turned off and the switch 132D is turned on, the voltage VL is outputted to the control line FB3 through the power source line VL0.

The control line FB0 is connected to the pixel 110A. The control line FB1 is connected to the pixel 110B. The control line FB2 is connected to the pixel 110C. The control line FB3 is connected to the pixel 110D.

Each of the voltage VH and the voltage VL may be generated by a single circuit. Otherwise, each of the voltage VH and the voltage VL may be generated by different circuits like the voltage VMA and the voltage VMB. That is, when the voltages VH supplied to the pixels 110A and 110B are voltages VHA and the voltages VH supplied to the pixels 110C and 110D are voltages VHB, the voltages VHA and VHB may be generated by different circuits. When the voltages VL supplied to the pixels 110A and 110B are voltages VLA and the voltages VL supplied to the pixels 110C and 110D are voltages VLB, the voltages VLA and VLB may be generated by different circuits. For example, the voltage supply circuit 101A may generate the voltages VHA and VLA, and the voltage supply circuit 101B may generate the voltages VHB and VLB.

Both the pixels 110A and 110B are connected to a bias line VBA. The pixel 110A is connected to a vertical signal line SIGA. The pixel 110B is connected to a vertical signal line SIGB. Both the pixels 110C and 110D are connected to a bias line VBB. The pixel 110C is connected to a vertical signal line SIGC. The pixel 110D is connected to a vertical signal line SIGD. The bias line VBA is connected to a bias circuit 121A. The bias line VBB is connected to a bias circuit 121B. The vertical signal line SIGA is connected to a current source switching circuit 122A. The vertical signal line SIGB is connected to a current source switching circuit 122B. The vertical signal line SIGC is connected to a current source switching circuit 122C. The vertical signal line SIGD is connected to a current source switching circuit 122D. The bias lines VBA and VBB extend in the direction in which the pixels 110A to 110D are arranged. The bias line VBA exemplifies a third line. The bias line VBB exemplifies a fourth line.

Figure 3:
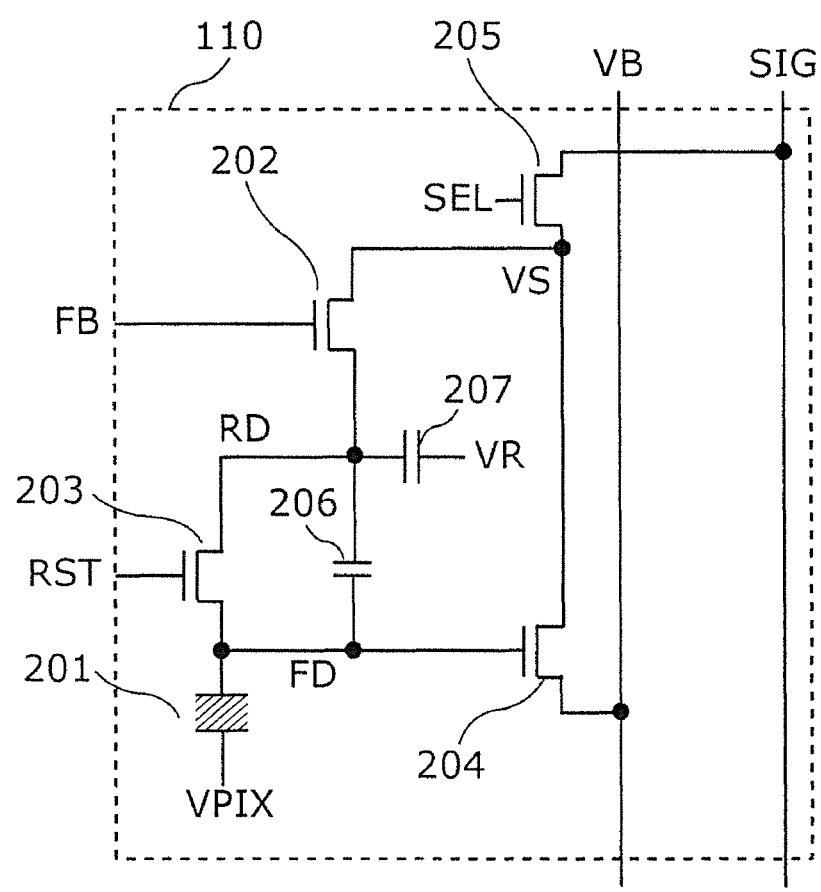
FIG. 3 is a diagram that illustrates a configuration of a pixel according to the first embodiment of the present disclosure.

FIG. 3 is a diagram that illustrates a configuration example of the pixel 110 (i.e., pixels 110A, 110B, 110C, and 110D) included in the imaging device 100 according to this embodiment. A control line FB illustrated in FIG. 3 corresponds to the control lines FB0 to FB3 illustrated in FIG. 2. A reset control line RST illustrated in FIG. 3 corresponds to reset control lines RST0 to RST3 illustrated in FIG. 2. A selection control line SEL illustrated in FIG. 3 corresponds to selection control lines SEL0 to SEL3 illustrated in FIG. 2. A charge accumulator FD illustrated in FIG. 3 corresponds to charge accumulators FD0 to FD3 illustrated in FIG. 2. A bias line VB illustrated in FIG. 3 corresponds to the bias lines VBA and VBB illustrated in FIG. 2. A vertical signal line SIG illustrated in FIG. 3 corresponds to the vertical signal lines SIGA to SIGD illustrated in FIG. 2.

The pixel 110 includes a photoelectric converter 201, a feedback transistor 202, a reset transistor 203, an amplification transistor 204, a selection transistor 205, a first capacitance element 206, a second capacitance element 207, and the charge accumulator FD.

The photoelectric converter 201 detects incident light and generates signal charges. The photoelectric converter 201 includes, for example, an upper electrode, a lower electrode, and a light reception layer between the upper and lower electrodes. The photoelectric converter 201 may be an embedded photodiode.

The charge accumulator FD accumulates the signal charges generated by the photoelectric converter 201. The charge accumulator FD may be formed of a diffusion layer or a line.

The first and second capacitance elements 206 and 207 may be, for example, metal insulator metal (MIM) capacitance or metal insulator semiconductor (MIS) capacitance.

A gate of the amplification transistor 204 is connected to the charge accumulator FD. One of a source and a drain of the amplification transistor 204 is connected to one of a source and a drain of the feedback transistor 202 and one of a source and a drain of the selection transistor 205. The other one of the source and the drain of the amplification transistor 204 is connected to the bias line VB. The other one of the source and the drain of the selection transistor 205 is connected to the vertical signal line SIG. The other one of the source and the drain of the feedback transistor 202 is connected to one of a source and a drain of the reset transistor 203. The other one of the source and the drain of the reset transistor 203 is connected to the charge accumulator FD.

The other one of the source and the drain of the feedback transistor 202 is connected to one end of the second capacitance element 207. A reference voltage VR is applied to the other end of the second capacitance element 207. The reference voltage VR is, for example, a ground potential GND. With the reference voltage VR applied to the other end of the second capacitance element 207, the feedback transistor 202 and the second capacitance element 207 form an RC filter circuit. Since the RC filter circuit functions as a low-pass filter, an operation bandwidth of the feedback transistor 202 is narrowed. This makes it possible to further narrow a noise bandwidth that is fed back in a later-described noise reduction period.

The other one of the source and the drain of the feedback transistor 202 is also connected to one end of the first capacitance element 206. The other end of the first capacitance element 206 is connected to the charge accumulator FD. In this specification, a node formed between the other one of the source and the drain of the feedback transistor 202, the one end of the first capacitance element 206, and the one end of the second capacitance element 207 is referred to as "node RD." The node RD is also referred to as a reset drain node.

A gate of the feedback transistor 202 is connected to the control line FB. The state of the feedback transistor 202 is determined based on the voltage applied to the gate from the control line FB. For example, when the voltage applied from the control line FB is at the high level, the feedback transistor 202 is turned on. At this moment, the charge accumulator FD, the amplification transistor 204, the feedback transistor 202, and the first capacitance element 206 form a feedback path.

When the voltage applied from the control line FB becomes lower than the high level, the feedback path is still being formed but a resistance of the feedback transistor 202 is increased. The bandwidth of the feedback transistor 202 is thus narrowed, and a frequency domain of the fed back signal is narrowed.

While the feedback path is being formed, the signal outputted by the feedback transistor 202 is attenuated by an attenuation circuit formed by the first capacitance element 206 and parasitic capacitance of the charge accumulator FD and is then fed back to the charge accumulator FD. When the capacitance of the first capacitance element 206 is Cc and the parasitic capacitance of the charge accumulator FD is Cfd, an attenuation rate B is expressed by Cc/(Cc+Cfd).

When the voltage applied from the control line FB is further decreased and reaches the low level, the feedback transistor 202 is turned off. In this case, the feedback path is not formed.

The one of the source and the drain of the reset transistor 203 is connected to the node RD. The other one of the source and the drain of the reset transistor 203 is connected to the charge accumulator FD. A gate of the reset transistor 203 is connected to the reset control line RST. The state of the reset transistor 203 is determined based on the voltage applied from the reset control line RST. For example, when the voltage applied from the reset control line RST is at the high level, the reset transistor 203 is turned on. As a result, the two ends of the first capacitance element 206, which are the charge accumulator FD and the node RD, are electrically connected to each other.

The other one of the source and the drain of the selection transistor 205 is connected to the vertical signal line SIG. A gate of the selection transistor 205 is connected to the selection control line SEL. The state of the selection transistor 205 is determined based on the voltage applied from the selection control line SEL. For example, when the voltage applied from the selection control line SEL is at the high level, the selection transistor 205 is turned on. As a result, the amplification transistor 204 and the vertical signal line SIG are electrically connected to each other. When the voltage applied from the selection control line SEL is at the low level, the selection transistor 205 is turned off. As a result, the amplification transistor 204 and the vertical signal line SIG are electrically separated from each other.

Figure 4:
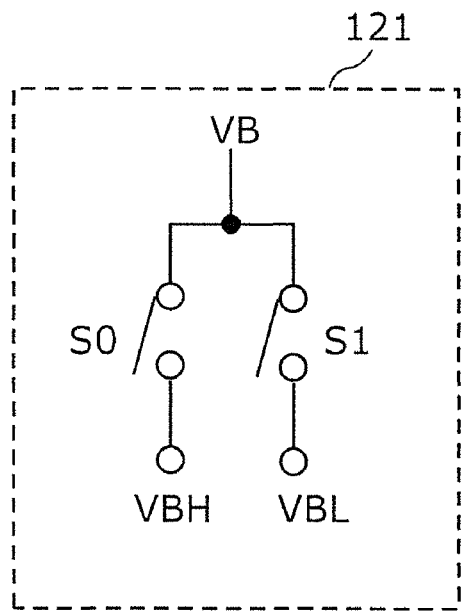
FIG. 4 is a diagram that illustrates a configuration of a bias circuit according to the first embodiment of the present disclosure.

FIG. 4 is a diagram that illustrates a configuration of a bias circuit 121 (i.e., bias circuits 121A and 121B). The bias circuit 121 includes a switch S0 and a switch S1 and outputs a high voltage VBH or a low voltage VBL to the bias line VB. Specifically, when the switch S0 is turned on and the switch S1 is turned off, the high voltage VBH is outputted to the bias line VB. When the switch S0 is turned off and the switch S1 is turned on, the low voltage VBL is outputted to the bias line VB. The high voltage VBH is, for example, a power source voltage VDD. The low voltage VBL is, for example, the ground potential GND.

Figure 5:
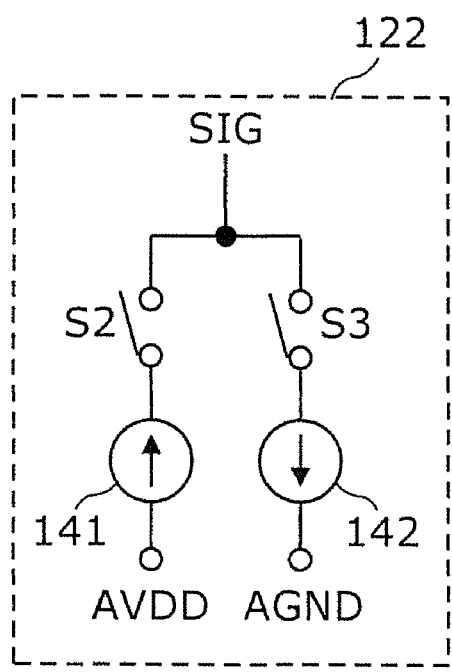
FIG. 5 is a diagram that illustrates a configuration of a current source switching circuit according to the first embodiment of the present disclosure.

FIG. 5 is a diagram that illustrates a configuration of a current source switching circuit 122 (i.e., current source switching circuits 122A, 122B, 122C, and 122D). The current source switching circuit 122 includes a switch S2, a switch S3, a constant current source 141, and a constant current source 142. The constant current source 141 is a P-type current source. The constant current source 141 puts a current into the vertical signal line SIG. The constant current source 142 is an N-type current source. The constant current source 142 draws a current from the vertical signal line SIG. The switch S2 is connected between the vertical signal line SIG and the constant current source 141. The switch S3 is connected between the vertical signal line SIG and the constant current source 142. When the switch S2 is turned on, the constant current source 141 is connected to the vertical signal line SIG. When the switch S3 is turned on, the constant current source 142 is connected to the vertical signal line SIG.

Figure 6:
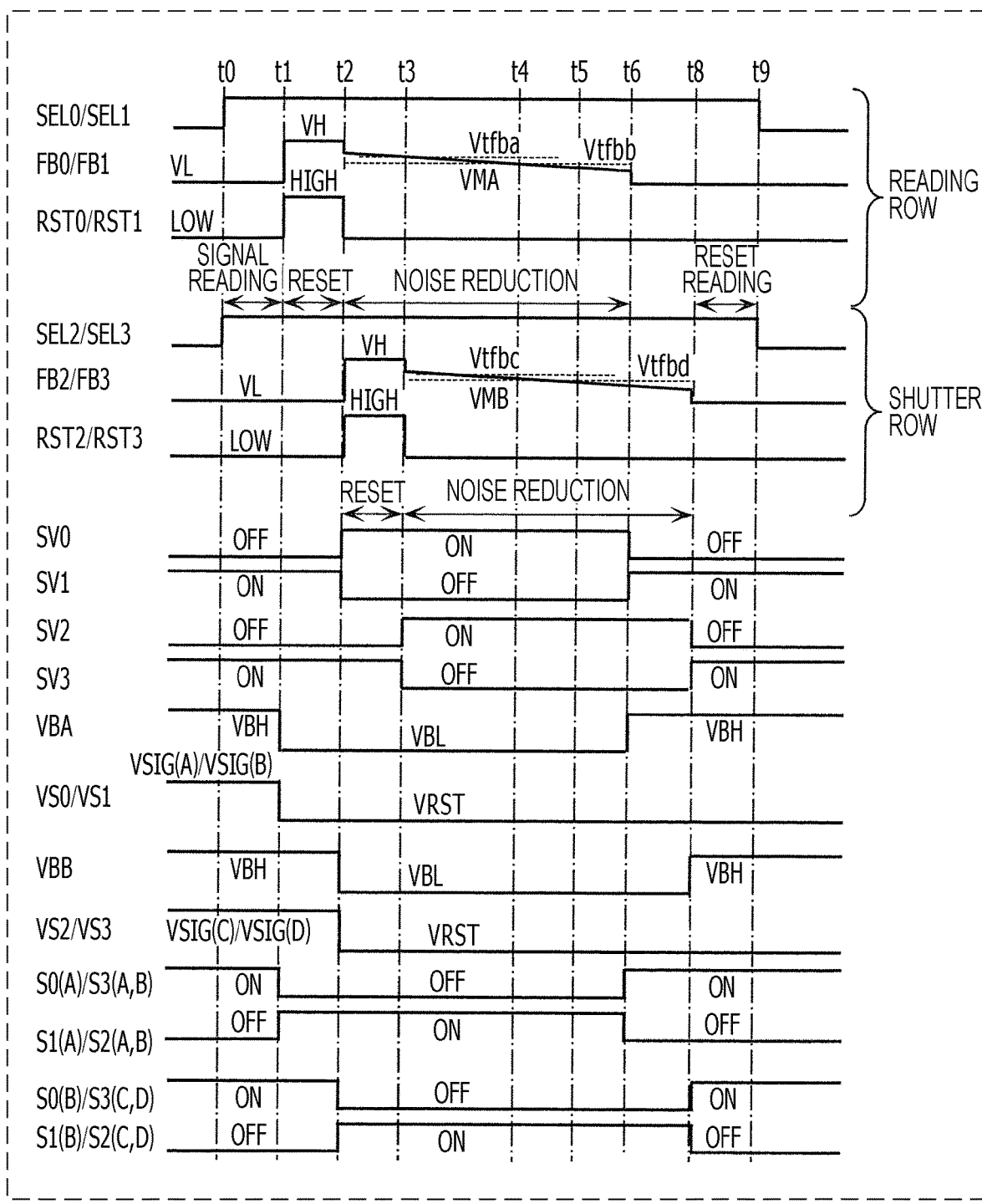
FIG. 6 is a timing chart of a first mode according to the first embodiment of the present disclosure.

FIG. 6 is an exemplified timing chart of a first mode for describing operations of the imaging device 100 when reading a signal. VS0/VS1 indicates changes of a voltage level of either of the source and the drain of the amplification transistor 204 that is not connected to the bias line VBA. VS2/VS3 indicates changes of a voltage level of either the source or the drain of the amplification transistor 204 that is not connected to the bias line VBB. S0(A)/S3(A, B) indicates the states of the switch S0 of the bias circuit 121A and the switch S3 of the current source switching circuits 122A and 122B. S1(A)/S2(A, B) indicates the states of the switch S1 of the bias circuit 121A and the switch S2 of the current source switching circuits 122A and 122B. S0(B)/S3(C, D) indicates the states of the switch S0 of the bias circuit 121B and the switch S3 of the current source switching circuits 122C and 122D. S1(B)/S2(C, D) indicates the states of the switch S1 of the bias circuit 121B and the switch S2 of the current source switching circuits 122C and 122D.

FIG. 6 illustrates an example in which, in the pixel array 102, the pixel 110A in the zeroth row and the pixel 110B in the first row are reset concurrently, and the pixel 110C in the second row and the pixel 110D in the third row are reset concurrently. In the example illustrated in FIG. 6, signal reading and reset reading are performed on the pixels 110A and 110B in the zeroth and first rows, and shutter operation is performed on the pixels 110C and 110D in the second and third rows.

Various control signals other than the control signals of the control lines FB0 to FB3 are generated by, for example, a (not-illustrated) control circuit included in the imaging device 100.

(Signal Reading Period)

At time t0, a selection control signal SEL0, which is applied to the gate of the selection transistor 205 of the pixel 110A in the zeroth row, and a selection control signal SEL1, which is applied to the gate of the selection transistor 205 of the pixel 110B in the first row, are at the high level. This allows the pixels 110A and 110B in the zeroth and first rows to be selected. In the bias circuit 121A at time t0, the switch S0 is turned on, and the switch 51 is turned off. Thus, the high voltage VBH is applied to the bias line VBA. The switch S3 of the current source switching circuits 122A and 122B is turned on. Thus, the selection transistor 205, the amplification transistor 204, and the constant current source 142 of the current source switching circuit 122A or 122B form a source follower circuit. As a result, potentials of the vertical signal lines SIGA and SIGB respectively become equal to a voltage VSIG (A) and a voltage VSIG (B) based on the signal charges accumulated in the charge accumulator FD. An amplification factor of the source follower circuit is about 1.

Based on a later-described reset voltage VRST, the voltages of the charge accumulators FD0 and FD1 are changed by the amount of the voltage based on the signal charge generated by the photoelectric converter 201 in a period between the last reset operation of the pixels 110A and 110B and time t0. The voltages of the charge accumulators FD0 and FD1 are amplified by the source follower circuit by the amplification factor of about 1 and outputted to the vertical signal lines SIGA and SIGB to be read.

(Reset Period)

Next, at time t1, the voltages applied to the control lines FB0 and FB1 and the reset control lines RST0 and RST1 are at the high level. This allows the feedback transistor 202 and the reset transistor 203 of the pixels 110A and 110B to be turned on. In the bias circuit 121A, the switch S0 is turned off and the switch S1 is turned on. Thus, the low voltage VBL is applied to the other one of the source and the drain of the amplification transistor 204 of the pixels 110A and 110B. In addition, in the current source switching circuits 122A and 122B at time t1, the switch S2 is turned on and the switch S3 is turned off. Thus, the one of the source and the drain of the selection transistor 205 of the pixels 110A and 110B is connected with the constant current source 141.

As a result, at time t1, the selection transistor 205, the amplification transistor 204, and the constant current source 141 of the pixel 110A form a source ground amplification circuit. Likewise, the selection transistor 205, the amplification transistor 204, and the constant current source 141 of the pixel 110B form the source ground amplification circuit. In addition, since the reset transistor 203 and the feedback transistor 202 of the pixels 110A and 110B are turned on, input and output ends of the source ground amplification circuits are short-circuited. This allows the source ground amplification circuits to be reset. When an output voltage from the reset source ground amplification circuit is VRST, the voltages of the charge accumulators FD0 and FD1 are equal to VRST.

At time t2, the voltages applied to the reset control lines RST0 and RST1 are at the low level. Thus, the reset transistor 203 of the pixels 110A and 110B is turned off. When the feedback transistor 202 is turned on and the reset transistor 203 is turned off, feedback circuits of an amplification factor of $-A \times B$ are formed in the pixels 110A and 110B. As a result, in the pixels 110A and 110B, the kTC noise generated in the charge accumulators FD0 and FD1 when the reset transistor 203 is turned off is reduced to $1/(1+A \times B)$ times.

At time t1, the voltages of the control lines FB0 and FB1 are set to the voltage VH at the high level. As a result, the operation bandwidth of the feedback transistor 202 of the pixels 110A and 110B becomes a first bandwidth that is a wide bandwidth. This allows the voltage of the charge accumulator FD to be set quickly to the reset voltage VRST. The first bandwidth means an operation bandwidth of the feedback transistor 202 in a case where the gate voltage is at the high level.

In this embodiment, the reset period is provided for quickly setting the voltage of the charge accumulator FD to the reset voltage VRST. It should be noted that, however, if there is extra time for driving, the reset period may not be provided, and the voltage of the charge accumulator FD may be set to the reset voltage within the later-described noise reduction period.

(Noise Reduction Period)

Next, in a period between time t2 and time t6, the voltage VMA generated by the voltage supply circuit 101A is applied to the control lines FB0 and FB1. The voltage VMA is gradually changed and passes a threshold voltage Vtfba of the feedback transistor 202 of the pixel 110A. The voltage VMA is also gradually changed and passes a threshold voltage Vtfbb of the feedback transistor 202 of the pixel 110B. That is, the feedback transistor 202 of the pixels 110A and 110B is gradually changed from the on-state to the off-state. Such changing of the voltage VMA allows the feedback transistor 202 of both the pixels 110A and 110B to be operated around the threshold voltages even when the threshold voltages of the feedback transistor 202 are varied between the pixels 110A and 110B. In this specification, such voltage application to the feedback transistor 202 in the noise reduction period is referred to as "tapered reset."

In this case, the operation bandwidth of the feedback transistor 202 of the pixels 110A and 110B becomes a second bandwidth that is narrower than the first bandwidth. The second bandwidth means an operation bandwidth of the feedback transistor 202 of the pixels 110A and 110B in a case where the gate voltage is the middle voltage.

As the second bandwidth is made substantially narrower than an operation bandwidth of the amplification transistor 204 of the pixels 110A and 110B, the effect of the noise reduction is enhanced. Meanwhile, the time between time t2 and time t6 becomes longer. Even when the second bandwidth is broader than the operation bandwidth of the amplification transistor 204 of the pixels 110A and 110B, it is still possible to obtain the noise reduction effect. Thus, the designer can arbitrary set the second bandwidth as long as the time between time t2 and time t6 has allowable length. Hereinafter, the second bandwidth is defined as a bandwidth that is substantially narrower than the operation bandwidth of the amplification transistor 204.

When the second bandwidth is narrower than the operation bandwidth of the amplification transistor 204, the thermal noise generated at the feedback transistor 202 is reduced to $1/(1+A \times B)^{1/2}$ times by the feedback circuit formed in the pixels 110A and 110B. In this state, at time t6, the voltage being applied to the control lines FB0 and FB1 is set to the low level, and the feedback transistor 202 of the pixels 110A and 110B is turned off. At this moment, a value of the kTC noise remaining in the charge accumulators FD0 and FD1 is the sum of squares of the kTC noise caused by the reset transistor 203 and the kTC noise caused by the feedback transistor 202.

When the capacitance of the second capacitance element 207 is Cs, the kTC noise of the feedback transistor 202 generated with reduction by the feedback is reduced to $(Cfd/Cs)^{1/2}$ times the kTC noise of the reset transistor 203 generated with no reduction by the feedback. According to this, when there is feedback, the kTC noise is reduced to $\{1+(1+A \times B) \times Cfd/Cs\}^{1/2}/(1+A \times B)$ times that with no feedback.

(Reset Reading Period)

After the reset operation and noise reduction operation of the pixels 110A and 110B are completed, at time t6 in FIG. 6, the switch S0 of the bias circuit 121A and the switch S3 of the current source switching circuits 122A and 122B are turned on. As a result, the source follower circuit is formed. At time t8, the reset voltage VRST is read. The correlated double sampling (CDS) can be performed by obtaining a difference between the voltages VSIG (A) and VSIG (B) read from the charge accumulators FD0 and FD1 and the reset voltage VRST. The CDS operation makes it possible to reduce the effect on the pixel signals due to the variations in the peripheral circuits.

With the imaging device 100 according to this embodiment, the kTC noise is reduced to $\{1+(1+A \times B) \times Cfd/Cs\}^{1/2}/(1+A \times B)$ times in the noise reduction period, and is then outputted to the vertical signal lines SIGA and SIGB with the amplification factor of about 1 in the reading period. As a result, it is possible to obtain favorable image data with the kTC noise reduced.

Desirably, the capacitance Cs of the second capacitance element 207 is greater than the capacitance Cc of the first capacitance element 206. Typically, when the capacitance of the second capacitance element 207 connected to the charge accumulator FD is increased, the random noise is reduced. However, because the signal level is decreased when converting the charge signal to the voltage signal in the charge accumulator FD, S/N is not consequently improved. In this respect, in this embodiment, since the charge accumulator FD and the node RD are separated by the first capacitance element 206, the signal level is less likely to be decreased even when the capacitance of the second capacitance element 207 is increased. As a result, only the random noise is reduced, and thus the effect of improvement in S/N can be obtained.

(Shutter Operation)

A shutter operation is performed on the pixel 110C in the second row and the pixel 110D in the third row, but no signal reading and reset reading are performed. The shutter operation is an operation for resetting the pixel 110 at the start of an exposure period for adjusting the length of the exposure period. That is, the shutter operation performed on the pixels 110C and 110D in the second and third rows is similar to the reset operation performed on the pixels 110A and 110B in the zeroth and first rows.

The reset start time in the shutter operation performed on the pixels 110C and 110D in the second and third rows, which is the time when the control lines FB2 and FB3 and the reset control lines RST2 and RST3 are set to the high level, is time t2. That is, the reset start time is set so as not to coincide with time t1, which is the time when the control lines FB0 and FB1 and the reset control lines RST0 and RST1 are set to the high level. In other words, the timing when the voltage applied to the bias line VBA is changed and the timing when the voltage applied to the bias line VBB is changed are set to be different. This makes it possible to reduce the noise more than a case where the group of the control lines FB0 and FB1 and the reset control lines RST0 and RST1 and the group of the control lines FB2 and FB3 and the reset control lines RST2 and RST3 are both concurrently set to the high level. The reason is described below. The voltage applied to the bias line VBA and the voltage applied to the bias line VBB are both changed when reset of the pixels 110C and 110D in the shutter operation is started. Once the voltages applied to the bias lines VBA and VBB are changed, the voltage of the charge accumulator FD is varied due to coupling. Thus, if the timing when the voltage applied to the bias line VBA is changed and the timing when the voltage applied to the bias line VBB is changed are the same, the charge accumulator FD is affected by the potential variations of the two bias lines. With the timings of changing the voltages applied to the bias lines VBA and VBB differentiated, it is possible to reduce the effect of the potential variations of the bias lines VBA and VBB on the charge accumulator FD in the pixel 110 at the start of reset. As a result, it is possible to achieve high-speed operation of the imaging device 100 while reducing the noise in the pixel 110.

In a period between time t3 and time t8, the voltage VMB generated by the voltage supply circuit 101B is applied to the control lines FB2 and FB3. The voltage VMB is gradually changed and passes a threshold voltage Vtfbc of the feedback transistor 202 of the pixel 110C and a threshold voltage Vtfbd of the feedback transistor 202 of the pixel 110D. Such changing of the voltage VMB allows the feedback transistor 202 of both the pixels 110C and 110D to be operated around the threshold voltages even when the threshold voltages of the feedback transistor 202 are varied between the pixels 110C and 110D. In this way, the tapered reset is performed on the pixels 110C and 110D.

In the above descriptions, the case where the signal reading and reset reading are performed on the pixels 110A and 110B in the zeroth and first rows and the shutter operation is performed on the pixels 110C and 110D in the second and third rows is described. However, the same applies to a case where the signal reading and reset reading are performed on the pixels 110A and 110B in the zeroth and first rows and the signal reading and reset reading are performed on the pixels 110C and 110D in the second and third rows, or a case where the shutter operation is performed on the pixels 110A and 110B in the zeroth and first rows and the shutter operation is performed on the pixels 110C and 110D in the second and third rows.

In the above descriptions, the timings of high/low switching of the voltages applied to the bias lines VBA and VBB are different in the first mode. However, the timings may be the same. In this case, the bias lines VBA and VBB may be integrated as a common bias line.

Figure 7:
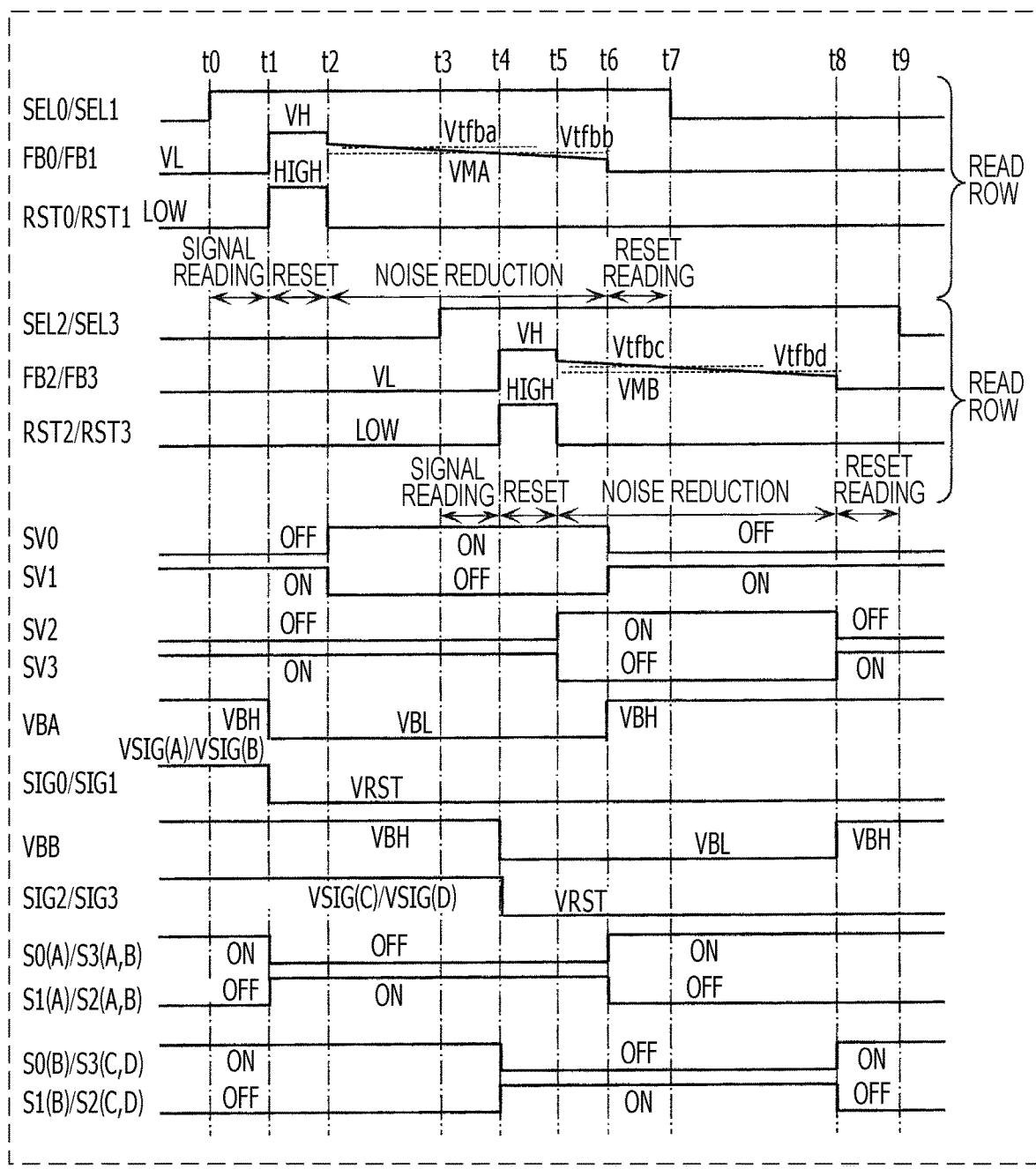
FIG. 7 is a timing chart of a second mode according to the first embodiment of the present disclosure.

FIG. 7 is an exemplary timing chart of a second mode for describing operations of the imaging device 100 when reading a signal. FIG. 7 is a timing chart of a case where the signal reading and reset reading are performed on the pixels 110A and 110B in the zeroth and first rows and also on the pixels 110C and 110D in the second and third rows.

In FIG. 7, the difference between the timings of the operations of the signal reading and reset reading on the pixels 110A and 110B in the zeroth and first rows and on the pixels 110C and 110D in the second and third rows is greater than that in FIG. 6. Except that the timings of the operations on the pixels 110A and 110B in the zeroth and first rows and on the pixels 110C and 110D in the second and third rows are different by almost a half phase, timings of each operation are substantially the same as those in FIG. 6. In the example illustrated in FIG. 7, in a period between time t1 and time t8, the potentials of the bias line VBA connected to the pixels 110A and 110B and the bias line VBB connected to the pixels 110C and 110D are different.

Specifically, the high voltage VBH is applied to the bias line VBA in a period until time t1 when the signal reading period of the pixels 110A and 110B in the zeroth and first rows ends. At time t1, the voltage applied to the bias line VBA is changed from the high voltage VBH to the low voltage VBL. The low voltage VBL is applied to the bias line VBA in a period between time t1 and time t6 including the reset period and the noise reduction period of the pixels 110A and 110B in the zeroth and first rows. At time t6, the voltage applied to the bias line VBA is changed from the low voltage VBL to the high voltage VBH. The high voltage VBH is applied to the bias line VBA in a period after time t6 when the reset reading period of the pixels 110A and 110B in the zeroth and first rows starts.

The high voltage VBH is applied to the bias line VBB in a period until time t4 when the signal reading period of the pixels 110C and 110D in the second and third rows ends. At time t4, the voltage applied to the bias line VBB is changed from the high voltage VBH to the low voltage VBL. The low voltage VBL is applied to the bias line VBB in a period between time t4 and time t8 including the reset period and the noise reduction period of the pixels 110C and 110D in the second and third rows. At time t8, the voltage applied to the bias line VBB is changed from the low voltage VBL to the high voltage VBH. The high voltage VBH is applied to the bias line VBB in a period after time t8 when the reset reading period of the pixels 110C and 110D in the second and third rows starts.

The second mode is a mode in which, for example, a period between the reset reading and the next reading is the exposure period and the shutter operation for adjusting the exposure period is not performed. For example, this mode is applicable when the signal reading and reset reading are performed on all the zeroth to third rows. It is possible to achieve the high-speed frame rate by operating the imaging device 100 in the second mode.

In FIG. 2, the pixels 110A, 110B, 110C, and 110D are respectively connected to the different vertical signal lines SIGA, SIGB, SIGC, and SIGD. However, the pixels 110A, 110B, 110C, and 110D may be connected to a common vertical signal line.

In the above descriptions, the voltages VMA and VMB are the tapered voltages. However, the voltages VMA and VMB may be fixed voltages between the voltage VH and the voltage VL. For example, the fixed voltage may be a voltage that is close to but higher than the threshold voltage of the feedback transistor 202.

Hereinafter, modifications of arrangement of the voltage supply circuits 101A and 101B are described.

Figure 8:
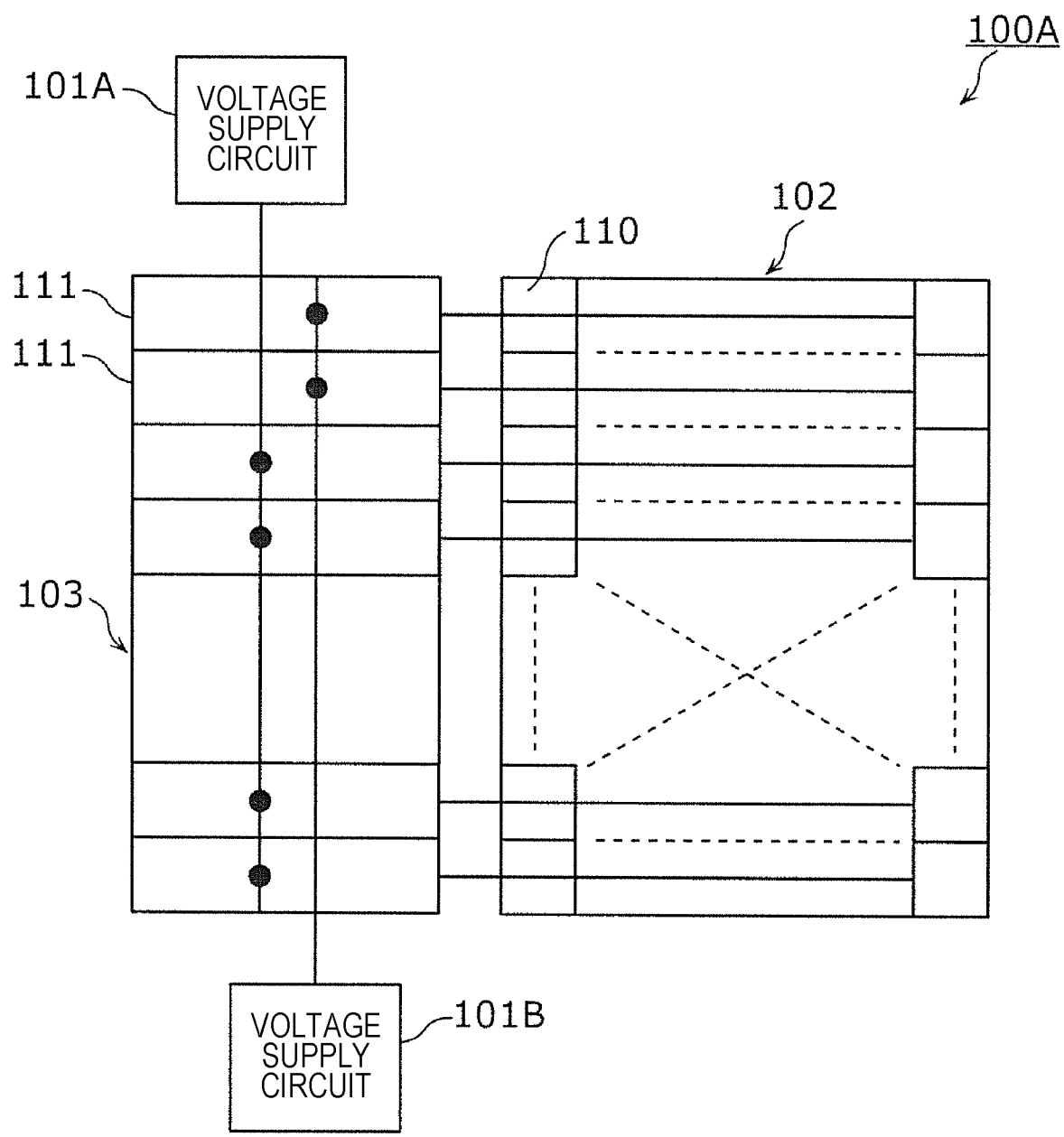
FIG. 8 is a block diagram of an imaging device according to a modification 1 of the first embodiment of the present disclosure.

FIG. 8 is a diagram that illustrates a configuration of an imaging device 100A according to a modification 1 of the first embodiment. In the imaging device 100A illustrated in FIG. 8, the voltage supply circuit 101A is arranged above the pixel array 102, and the voltage supply circuit 101B is arranged below the pixel array 102. With this arrangement, delays of the application of the voltage VMA from the voltage supply circuit 101A and the application of the voltage VMB from the voltage supply circuit 101B can be averaged between the upper and lower rows. As a result, it is possible to uniform the shading.

Figure 9:
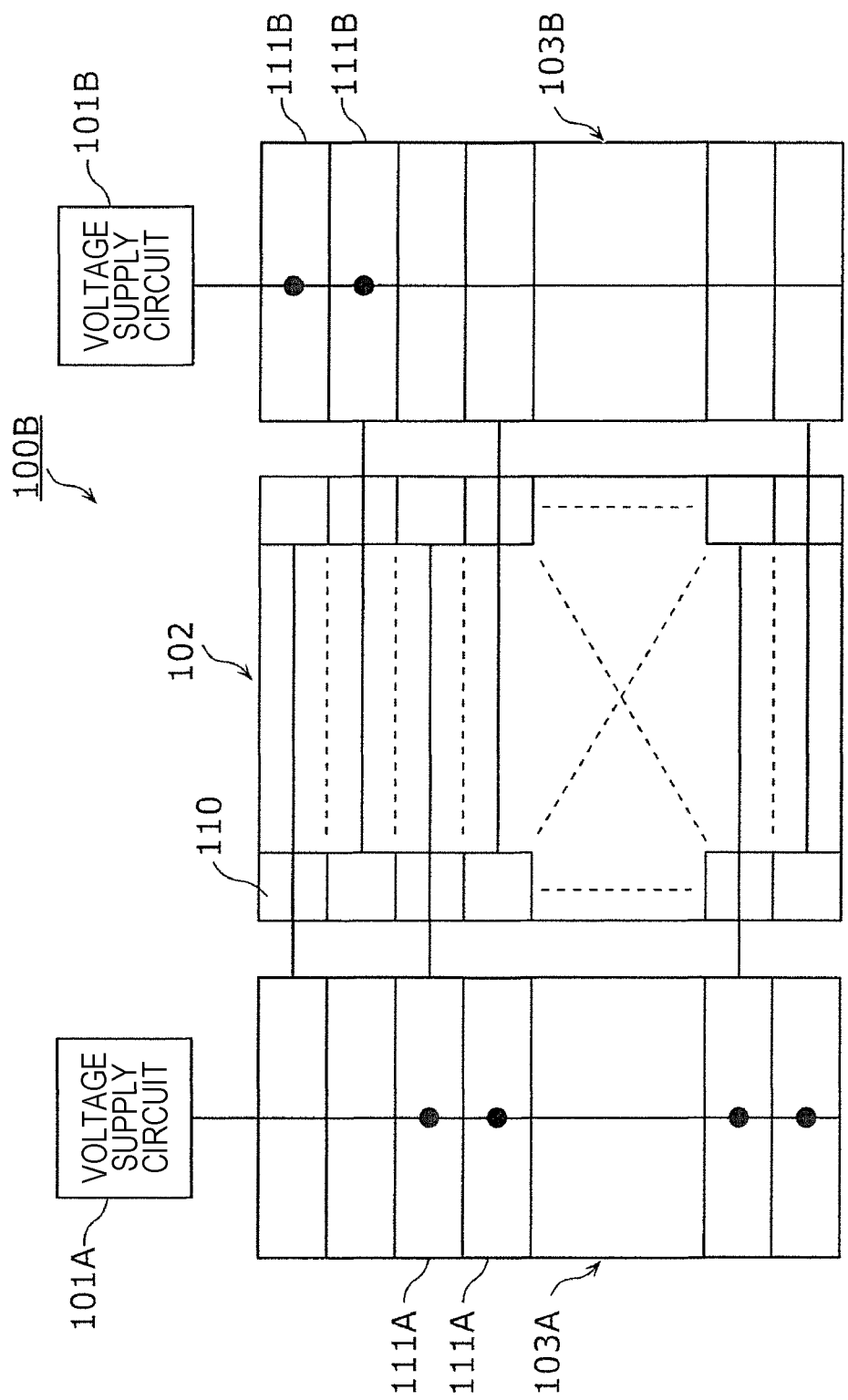
FIG. 9 is a block diagram of an imaging device according to a modification 2 of the first embodiment of the present disclosure.

FIG. 9 is a diagram that illustrates a configuration of an imaging device 100B according to a modification 2 of the first embodiment. The imaging device 100B illustrated in FIG. 9 includes a row selection circuit 103A arranged on the left of the pixel array 102 and a row selection circuit 103B arranged on the right of the pixel array 102. The voltage supply circuit 101A is arranged on the left of the pixel array 102 and the voltage supply circuit 101B is arranged on the right of the pixel array 102. The row selection circuit 103A includes multiple row drivers 111A. The multiple row drivers 111A are out of the multiple row drivers 111 illustrated in FIG. 1, which are supplied with the voltage VMA from the voltage supply circuit 101A. The row selection circuit 103B includes multiple row drivers 111B. The multiple row drivers 111B are out of the multiple row drivers 111 illustrated in FIG. 1, which are supplied with the voltage VMB from the voltage supply circuit 101B.

With this arrangement, the balance of the circuit positions of the voltage supply circuits 101A and 101B and the row selection circuits 103A and 103B on the entire chip is improved. Specifically, a distance from the row selection circuit 103A on the left of the pixel array 102 to the pixel 110 and a distance from the row selection circuit 103B on the right of the pixel array 102 to the pixel 110 can be equalized. In addition, when the pixel array 102 and the row selection circuits 103A and 103B are arranged on one chip, the center of the chip and the center of the pixel array 102 can be easily aligned. Moreover, coupling of the line for outputting the voltage VMA from the voltage supply circuit 101A and the line for outputting the voltage VMB from the voltage supply circuit 101B can be reduced. As a result, it is possible to reduce the noise in the voltages VMA and VMB and thus to improve the image quality features.

Figure 10:
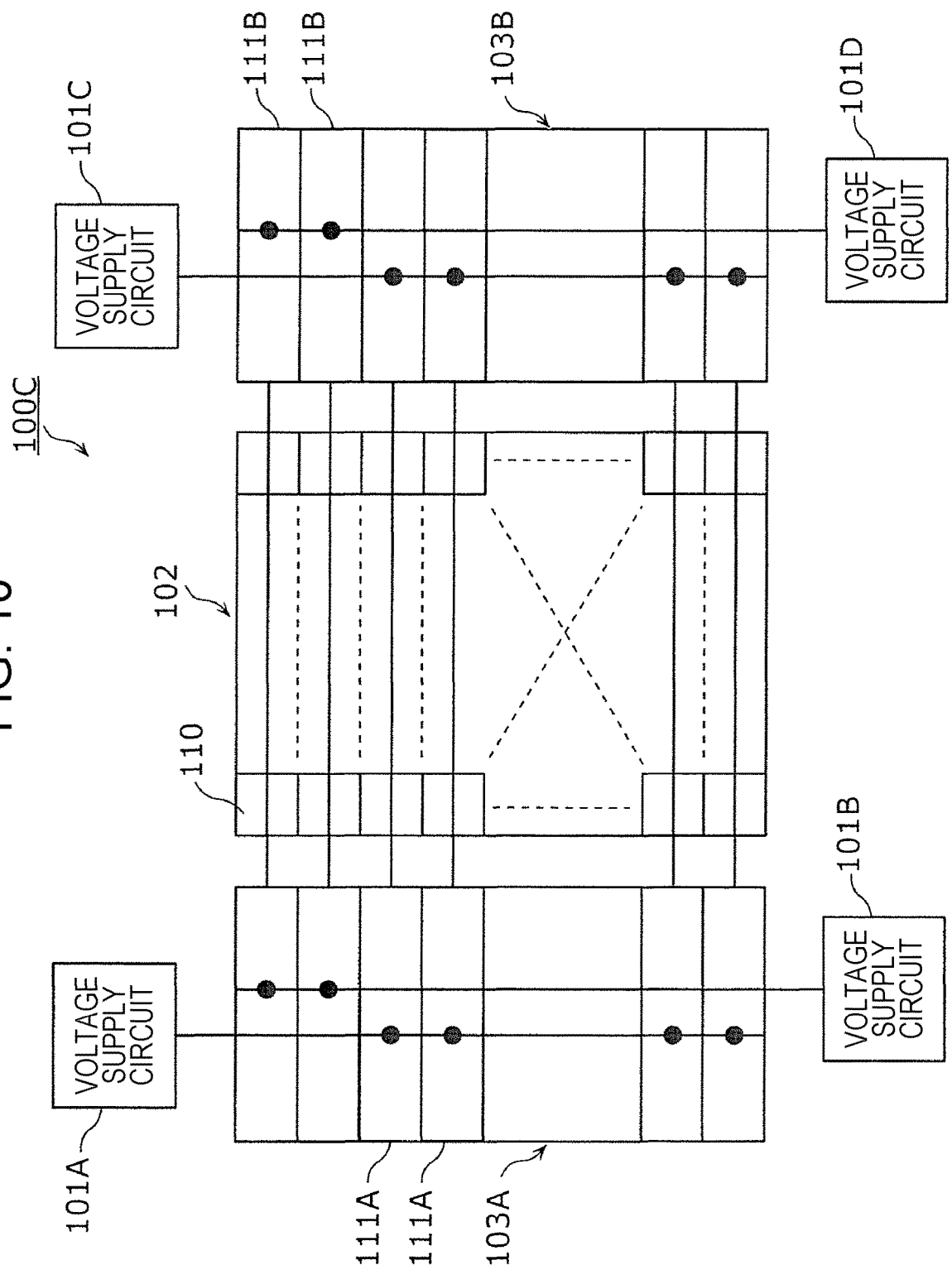
FIG. 10 is a block diagram of an imaging device according to a modification 3 of the first embodiment of the present disclosure.

FIG. 10 is a diagram that illustrates a configuration of an imaging device 100C according to a modification 3 of the first embodiment. The imaging device 100C illustrated in FIG. 10 includes four voltage supply circuits 101A, 101B, 101C, and 101D. The voltage supply circuit 101A is arranged on the upper left of the pixel array 102. The voltage supply circuit 101B is arranged on the lower left of the pixel array 102. The voltage supply circuit 101C is arranged on the upper right of the pixel array 102. The voltage supply circuit 101D is arranged on the lower right of the pixel array 102. The imaging device 100C further includes the row selection circuit 103A arranged on the left of the pixel array 102 and the row selection circuit 103B arranged on the right of the pixel array 102.

In this case, configurations of the voltage supply circuits 101A and 101B and the row selection circuit 103A are the same as those of the voltage supply circuits 101A and 101B and the row selection circuit 103 illustrated in FIG. 8. The configurations of the voltage supply circuits 101C and 101D and the row selection circuit 103B are the same as those of the voltage supply circuits 101A and 101B and the row selection circuit 103A except the arranged positions.

In this arrangement, the outputs of the row selection circuits 103A and 103B arranged on the right and left are short-circuited in the pixel array 102. Specifically, the outputs from the voltage supply circuit 101A and the voltage supply circuit 101C are inputted to the same pixel 110, and the outputs from the voltage supply circuit 101B and the voltage supply circuit 101D are inputted to the same pixel 110. For example, when the voltage supply circuits and the row selection circuit are arranged on only the left of the pixel array 102, supplying of the voltage to the pixel 110 in the right end of the pixel array 102 may be delayed. However, as the row selection circuits and the voltage supply circuits are arranged on the right and left of the pixel array 102 and the voltages are supplied from the right and left voltage supply circuits to the pixel 110, it is possible to drive the multiple pixels 110 at high-speed.

Figure 11:
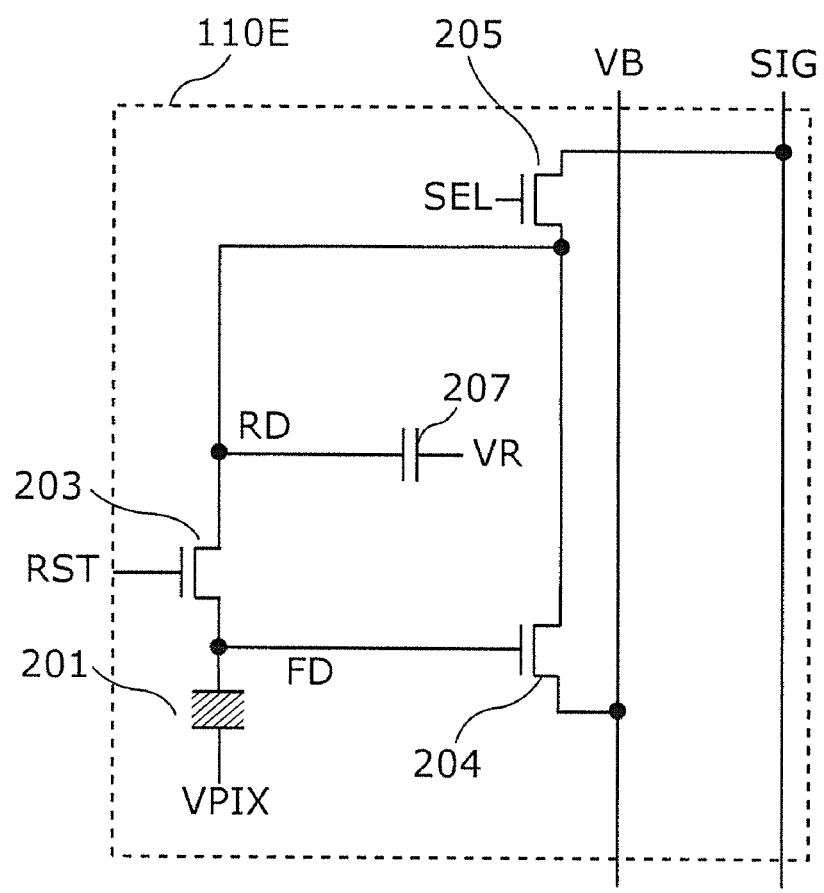
FIG. 11 is a diagram that illustrates a configuration of a pixel according to a modification 4 of the first embodiment of the present disclosure.

Hereinafter, modifications of the pixel 110 are described. FIG. 11 is a diagram that illustrates a configuration of a pixel 110E according to a modification 4 of the first embodiment. The pixel 110E illustrated in FIG. 11 is different from the pixel 110 illustrated in FIG. 3 in that the pixel 110E does not include the feedback transistor 202 and the first capacitance element 206. That is, one of the source and the drain of the reset transistor 203, one of the source and the drain of the selection transistor 205, and one of the source and the drain of the amplification transistor 204 are connected to each other. The signal of the control line FB illustrated in FIGS. 6 and 7 is inputted as the signal of the reset control line RST applied to the gate of the reset transistor 203. As a result, like the configuration illustrated in FIG. 3, it is possible to reduce the reset noise by performing the tapered reset.

Figure 12:
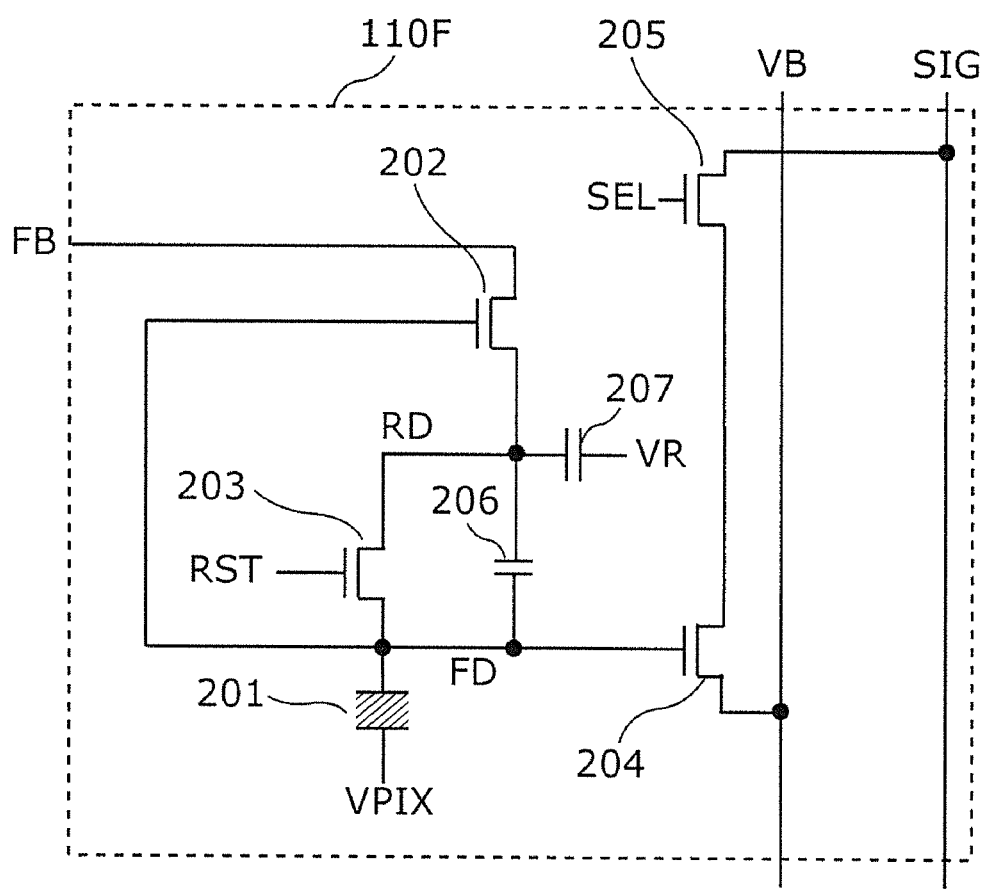
FIG. 12 is a diagram that illustrates a configuration of a pixel according to a modification 5 of the first embodiment of the present disclosure.

FIG. 12 is a diagram that illustrates a configuration of a pixel 110F according to a modification 5 of the first embodiment. The pixel 110F illustrated in FIG. 12 is different from the pixel 110 illustrated in FIG. 3 in that the control line FB is connected to the one of the source and the drain of the feedback transistor 202. The gate of the feedback transistor 202 is connected to the charge accumulator FD. For configurations of the constituents other than the pixel, the configurations and operations of the abovementioned imaging devices 100 and 100A to 100C can be applied. In this configuration, like the configuration illustrated in FIG. 3, it is possible to reduce the reset noise by performing the tapered reset as well.

Second Embodiment

Figure 13:
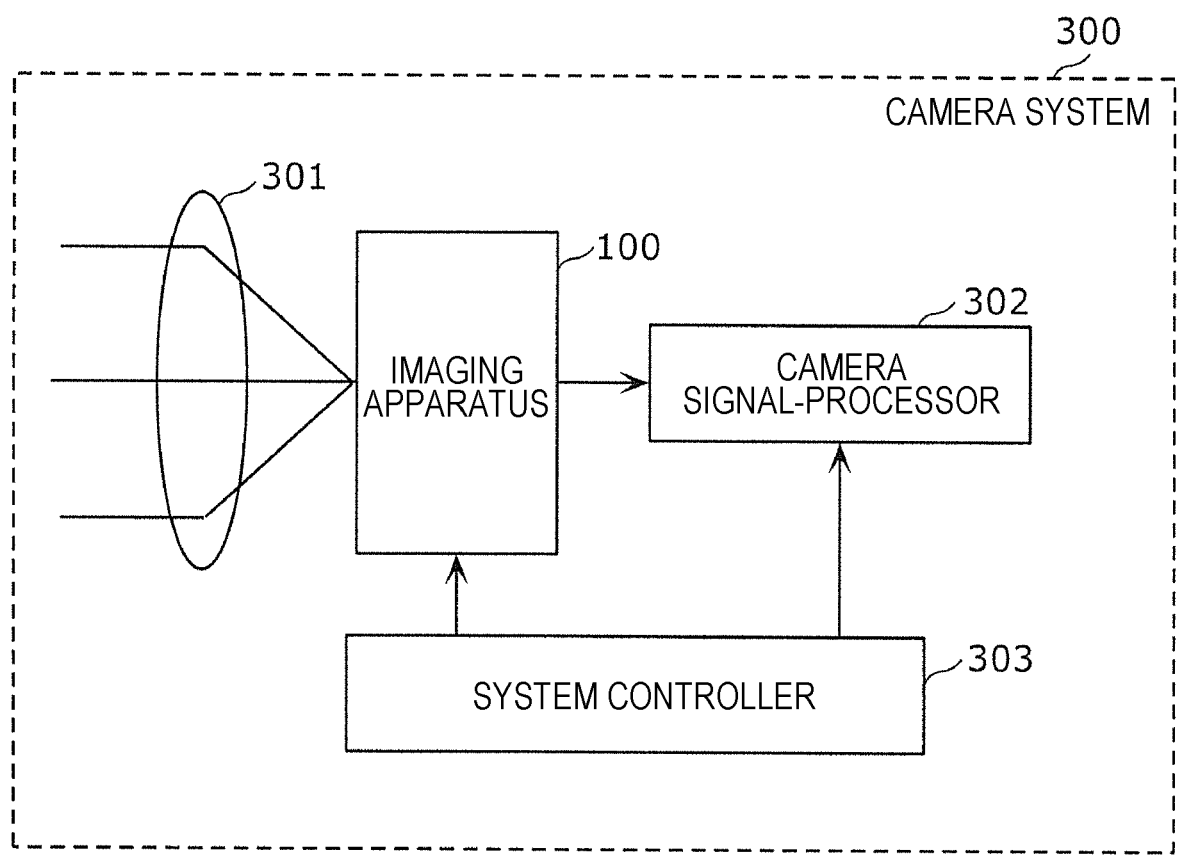
FIG. 13 is a block diagram that illustrates a configuration example of a camera system, including the imaging device, according to a second embodiment of the present disclosure.

A camera system according to a second embodiment of the present disclosure is described with reference to FIG. 13. FIG. 13 is a diagram that illustrates an example of a configuration of a camera system 300 including the imaging device 100 according to the first embodiment.

The camera system 300 includes the imaging device 100 described in the first embodiment, an optical system 301 such as a lens for condensing light, a camera signal-processor 302 for signal-processing the data imaged by the imaging device 100 and outputting the signal-processed data as an image or data, and a system controller 303 for controlling the imaging device 100 and the camera signal-processor 302.

The camera system 300 of this embodiment can achieve high-speed operation while reducing the reset noise by using the imaging device 100.

The imaging device and the camera system according to the embodiments of the present disclosure are described above. However, the present disclosure is not limited to the embodiments.

For example, the divisions of the functional blocks in the block diagrams are merely an example, and multiple functional blocks may be implemented as a single functional block, a single functional block may be divided into multiple, or a part of a functional block may be moved to another functional block.

Each of the processors included in the devices according to the above embodiments is typically implemented as an LSI such as an integrated circuit. The LSI may be individually formed as chips, or one chip may be formed so as to include a part or all of the processors.

The technique of implementing the integrated circuit is not limited to the LSI and may be implemented by using a dedicated circuit or a general-purpose processor. A field programmable gate array (FPGA) that can be programmed after the manufacture of the LSI or a reconfigurable processor in which the connections and the settings of circuit cells disposed inside the LSI can be reconfigured may be used.

In the above embodiments, a part of the constituents may be implemented by executing a software program suitable for the constituents. The constituents may be implemented by a program execution unit such as a CPU and a processor that reads and executes the software program recorded in a record medium such as a hard disk and a semiconductor memory.

The imaging device and the camera system according to the one or more aspects are described above based on the embodiments. However, the present disclosure is not limited to the embodiments. An embodiment obtained by adding various modifications conceived by those skilled in the art to the above embodiment, and an embodiment configured by combining the constituents of different embodiments may also be included in the scope of the one or more aspects without departing from the gist of the present disclosure.

In this specification, when the description states that an element is "connected" to another element, it means that a third element may be interposed between these elements. When the description states that an element is "directly connected" to another element, it means that there is no third element interposed between these elements. In addition, when the description states that an element is "electrically connected" to another element, it means that these elements need not be always electrically connected and may be electrically connected at least at a certain point in time.

The present disclosure can be applied to various camera systems and sensor systems including a digital still camera, medical camera, monitoring camera, vehicle-mounted camera, digital single-lens reflex camera, digital mirrorless single-lens camera, and so on.

What is claimed is:

1. An imaging device comprising:
a first pixel and a second pixel that are arranged along a first direction, the first pixel and the second pixel each including a photoelectric converter that converts light into a charge, a charge accumulator that accumulates the charge, a first transistor one of a source and a drain of which is connected to the charge accumulator, and a second transistor a gate of which is connected to the charge accumulator;
a first line and a second line that each extend along the first direction;
a first voltage supply circuit that is connected to the first transistor of the first pixel through the first line, the first voltage supply circuit being configured to generate a third voltage, the third voltage being a voltage between a first voltage turning on the first transistor of the first pixel and a second voltage turning off the first transistor of the first pixel; and
a second voltage supply circuit that is connected to the first transistor of the second pixel through the second line, the second voltage supply circuit being configured to generate a sixth voltage, the sixth voltage being a voltage between a fourth voltage turning on the first transistor of the second pixel and a fifth voltage turning off the first transistor of the second pixel.

2. The imaging device according to claim 1, further comprising:
a first bias circuit that is connected to one of a source and a drain of the second transistor of the first pixel; and
a second bias circuit that is connected to one of a source and a drain of the second transistor of the second pixel.

3. The imaging device according to claim 2, wherein
the first bias circuit generates two voltages different from each other, and
the second bias circuit generates two voltages different from each other.

4. The imaging device according to claim 2, further comprising
a third line and a fourth line that each extend along the first direction, wherein
the first bias circuit is connected to the one of the source and the drain of the second transistor of the first pixel through the third line, and
the second bias circuit is connected to the one of the source and the drain of the second transistor of the second pixel through the fourth line.

5. The imaging device according to claim 1, wherein
the first voltage supply circuit is connected to a gate of the first transistor of the first pixel, and
the second voltage supply circuit is connected to a gate of the first transistor of the second pixel.

6. The imaging device according to claim 1, wherein
the first voltage supply circuit is connected to the other one of the source and the drain of the first transistor of the first pixel, and
the second voltage supply circuit is connected to the other one of the source and the drain of the first transistor of the second pixel.

7. The imaging device according to claim 1, wherein each of the third voltage and the sixth voltage has a voltage value that is changed with time in a tapered shape.

8. The imaging device according to claim 1, wherein the first pixel and the second pixel each include a third transistor connected between the charge accumulator and the one of the source and the drain of the first transistor.

9. The imaging device according to claim 2, further comprising
a first vertical signal line and a second vertical signal line that each extend in the first direction, wherein
the first vertical signal line is connected to the other one of the source and the drain of the second transistor of the first pixel, and the second vertical signal line is connected to the other one of the source and the drain of the second transistor of the second pixel.

10. The imaging device according to claim 3, further comprising
a first vertical signal line and a second vertical signal line that each extend in the first direction, wherein
the first vertical signal line is connected to the other one of the source and the drain of the second transistor of the first pixel, and
the second vertical signal line is connected to the other one of the source and the drain of the second transistor of the second pixel.

11. The imaging device according to claim 4, further comprising
a first vertical signal line and a second vertical signal line that each extend in the first direction, wherein
the first vertical signal line is connected to the other one of the source and the drain of the second transistor of the first pixel, and
the second vertical signal line is connected to the other one of the source and the drain of the second transistor of the second pixel.

12. The imaging device according to claim 9, wherein
the first pixel includes a fourth transistor connected between the first vertical signal line and the other one of the source and the drain of the second transistor, and
the second pixel includes a fifth transistor connected between the second vertical signal line and the other one of the source and the drain of the second transistor.

13. The imaging device according to claim 10, wherein
the first pixel includes a fourth transistor connected between the first vertical signal line and the other one of the source and the drain of the second transistor, and
the second pixel includes a fifth transistor connected between the second vertical signal line and the other one of the source and the drain of the second transistor.

14. The imaging device according to claim 11, wherein
the first pixel includes a fourth transistor connected between the first vertical signal line and the other one of the source and the drain of the second transistor, and
the second pixel includes a fifth transistor connected between the second vertical signal line and the other one of the source and the drain of the second transistor.

* * * * *